(12) United States Patent
Borkenhagen et al.

(10) Patent No.: US 6,754,858 B2
(45) Date of Patent: Jun. 22, 2004

(54) SDRAM ADDRESS ERROR DETECTION METHOD AND APPARATUS

(75) Inventors: John Michael Borkenhagen, Rochester, MN (US); Brian T. Vanderpool, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 530 days.

(21) Appl. No.: 09/820,436

(22) Filed: Mar. 29, 2001

(65) Prior Publication Data

US 2002/0144210 A1 Oct. 3, 2002

(51) Int. Cl.[7] .............................. G11C 29/00; G06F 7/02
(52) U.S. Cl. ....................................... 714/720; 714/819
(58) Field of Search ................................ 714/718, 719, 714/720, 722, 723, 735, 736, 743, 768, 819

(56) References Cited

U.S. PATENT DOCUMENTS 5,757,817 A * 5/1998 Bolyn et al. ................. 714/719
5,940,875 A * 8/1999 Inagaki et al. .............. 711/217
6,457,154 B1 * 9/2002 Chen et al. .................. 714/768
6,502,216 B1 * 12/2002 Takano ........................ 714/738
6,564,346 B1 * 5/2003 Vollrath et al. .............. 714/723

* cited by examiner

*Primary Examiner*—Albert Decady
*Assistant Examiner*—Matthew C. Dooley
(74) *Attorney, Agent, or Firm*—Joan Pennington (57) ABSTRACT

Synchronous dynamic random access memory (SDRAM) method and apparatus are provided for implementing address error detection. Addressing errors are detected on the memory interface independent of data ECC, with reduced memory read access latency and improved processor performance. Addressing errors are detected while allowing differentiation between memory addressing failures that are required to stop the system and memory cell failures that allow continued operation. A predefined pattern is generated for a write burst to the SDRAM. The predefined pattern is dependent on a write address. A bit of the predefined pattern is sequentially stored into the SDRAM on each burst transfer of the write burst to the SDRAM. An expected pattern is generated from a read address for a read burst. The stored predefined pattern is retrieved during a read burst. The retrieved predefined pattern is compared to the generated expected pattern for identifying a type of an addressing error.

20 Claims, 7 Drawing Sheets

FIG. 1

ADDRESS MAPPING 200

| ADDRESS | 24 23 22 21 20 19 18 17 16 15 14 13 12 11 10 | 9 8 | 7 6 | 5 4 3 | 2 1 0 |
|---|---|---|---|---|---|
| FUNCTION | ROW 11:0 | | COLUMN 7:3 | BANK SELECT 1:0 | COLUMN 2:0 BURST INDEX | NOT USED 8B INTERFACE |

SDRAM ADDRESS ERROR DETECTION METHOD AND APPARATUS

FIELD OF THE INVENTION

The present invention relates generally to the data processing field, and more particularly, relates to a synchronous dynamic random access memory (SDRAM) address error detection method and apparatus for implementing address error detection.

DESCRIPTION OF THE RELATED ART

Parity is commonly used on processor chip system busses to detect bus transaction errors and to improve system reliability. Recently, in some systems parity is being replaced with error correction codes (ECC). ECC allow both detection and correction of errors on processor chip system busses.

One common ECC method used is called Single Error Correct Double Error Detect (SECDED). As the name indicates, all single bit and double bit errors are detected and single bit errors are corrected.

Dynamic random access memory (DRAM) storage interfaces in high reliability systems, such as server computers, use ECC schemes, such as SECDED to detect and correct DRAM chip data bit failures. While known ECC schemes protect against data bit failures, these ECC schemes do not protect against addressing failures. A defect on the address net or connector to the DRAM or an address failure in the addressing distribution circuitry on the DRAM chip itself will result in fetching the wrong data from the wrong memory location. In this situation, the ECC will be fetched with its associated data and no error will be detected.

To protect against addressing errors, address parity is commonly used. When an addressing error is reported, processing is halted. Single bit memory cell fails should be correctable and the processor should continue to run. However, address parity cannot be simply stored as a single separate bit in the memory because a single bit fail in the address parity memory cell could not be distinguished from an addressing error.

Address parity is sometimes incorporated into the ECC scheme. For example, address parity is generated on the address used to write the data to the SDRAM, incorporated into the ECC scheme, and the ECC is stored with the data. When data is read from the DRAM, the address parity is recreated from the ECC bits read from the SDRAM and compared with the expected address parity. The expected address parity is generated from the address used to read the SDRAM. An addressing error is reported if the expected address parity does not match the address parity recreated from the ECC bits read from the SDRAM.

There are advantages of incorporating address error detection into the ECC scheme rather than storing address parity in an address parity memory cell in the SDRAM. Incorporating address error detection into the ECC scheme allows detection and correction of all single bit errors, including a single bit error in the ECC. Incorporating address parity into the ECC scheme enables reduction of the number of bits required to support both ECC and address error checking.

In computer system configurations, memory read data originates in a DRAM, is transferred to a memory control chip, and is passed from the memory control chip across a system bus to a processor. The DRAM connected to the memory control chip may be a cache or main memory. The delay of getting the data from the DRAM to the processor is part of memory read latency. Reducing memory read latency increases processor performance. If the data ECC scheme used on the memory interface and the processor bus is identical, latency can be reduced by not having to hold up data in the memory control chip to regenerate ECC before sending it to the processor. There is no need for address parity on the processor system bus, so processor bus ECC schemes do not include address parity. If the memory interface incorporates address parity into the ECC, the ECC must be regenerated before being sent on the system bus. This adds memory latency.

A need exists for an effective mechanism to protect against addressing failures. It is desirable to provide a synchronous dynamic random access memory (SDRAM) method and apparatus for implementing address error detection.

SUMMARY OF THE INVENTION

A principal object of the present invention is to provide a synchronous dynamic random access memory (SDRAM) method and apparatus for implementing address error detection. Other important objects of the present invention are to provide such SDRAM method and apparatus for implementing address error detection substantially without negative effect and that overcome many of the disadvantages of prior art arrangements.

In brief, synchronous dynamic random access memory (SDRAM) method and apparatus are provided for implementing address error detection. A predefined pattern is generated for a write burst to the SDRAM. The predefined pattern is dependent on a write address. A bit of the predefined pattern is sequentially stored into the SDRAM on each burst transfer of the write burst to the SDRAM. An expected pattern is generated from a read address for a read burst. The stored predefined pattern is retrieved during a read burst. The retrieved predefined pattern is compared to the generated expected pattern for identifying a type of an addressing error.

In accordance with features of the invention, a sequence of the compared stored predefined pattern is used to distinguish the difference between an addressing failure and an address parity memory cell failure. The predefined pattern is generated for a write burst to the SDRAM by calculating an odd address parity on the write address. If the odd address parity on the write address is a one, then a first predefined pattern, such as 10101010 is written one bit each transfer of the address parity memory cell during the transfer of the burst 8 write. If the odd address parity on the read address is a zero, then a second predefined pattern, such as 01010101 is written one bit each transfer of the address parity memory cell during the transfer of the burst 8 write. Alternatively, the predefined pattern is generated for a write burst to the SDRAM by calculating an error correction code (ECC) on the write address. For example, an ECC code is used on the write address with a property of single-bit correct, double-bit detect. This enables the detection of a stuck-at address line, while distinguishing the difference between an addressing failure and an address parity memory cell failure.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
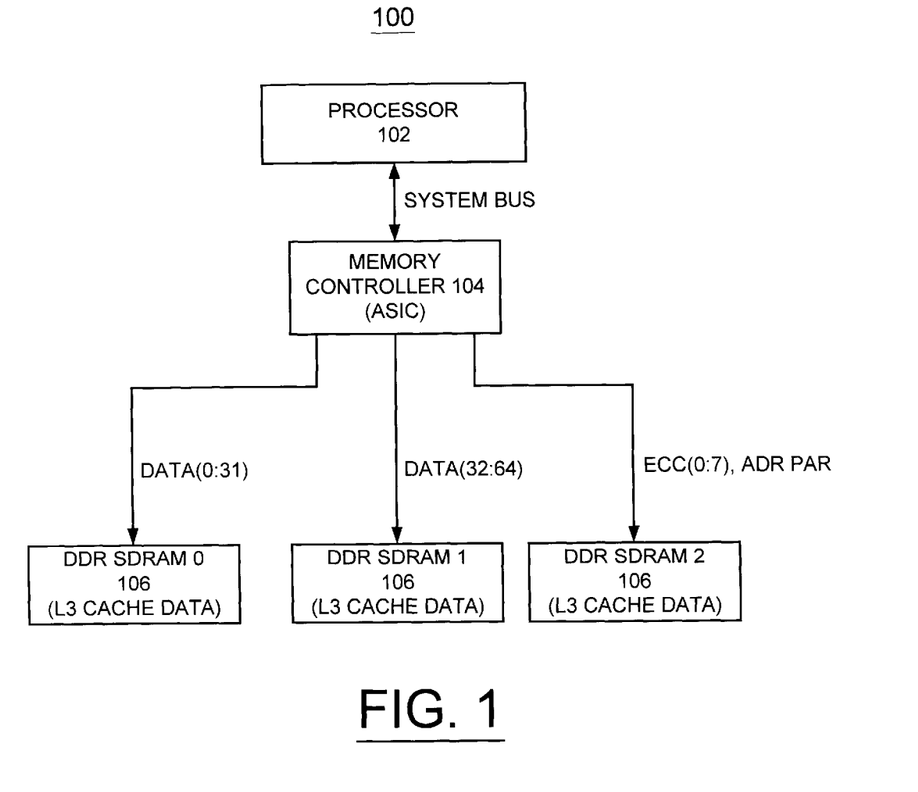
FIG. 1 is a block diagram representation illustrating a computer system for implementing synchronous dynamic random access memory (SDRAM) method for implementing address error detection in accordance with the preferred embodiment.

Having reference now to the drawings, in FIG. 1, there is shown a computer or data processing system of the preferred embodiment generally designated by the reference character 100 for implementing a synchronous dynamic random access memory (SDRAM) method for implementing address error detection. As shown in FIG. 1, computer system 100 includes a processor 102 coupled to a memory controller 104 by a system bus. Memory controller 104 is coupled to an L3 cache formed by a plurality of double data rate (DDR) synchronous dynamic random access memory (SDRAM) 0-2, 106.

Memory controller 104 is suitably programmed to execute the flow charts of FIGS. 3, 4, 5 and 6 of the preferred embodiment. Computer system 100 may be implemented using any suitable computer, such as an IBM personal computer running the OS/2® operating system.

In accordance with features of the preferred embodiments, addressing errors are detected on the memory interface using a processor bus SECDED ECC method, with reduced memory read access latency and improved processor performance. Addressing errors are detected while allowing differentiation between memory addressing failures that are required to stop the system 100 and memory cell failures that allow continued operation.

In accordance with features of the preferred embodiments, addressing errors are detected with accesses to cache and main memory that are done with burst transfers. Burst transfer length is programmed into a SDRAM mode register of DDR SDRAM 0-2, 106. Burst transfers are used because processor memory interfaces normally work on a cache line granularity and cache line operations require multiple SDRAM accesses. Operating in burst mode reduces the amount of traffic on the SDRAM address/command bus. SDRAM burst transfers are done in a predefined address sequence determined by the address and the SDRAM mode register settings. Either sequential or interleave burst addressing can be programmed into the SDRAM mode register.

In accordance with features of the preferred embodiments, a single memory cell at each address location is used to store address parity. The predefined burst address sequence is used to distinguish the difference between an addressing failure and an address parity memory cell failure.

In accordance with a first preferred embodiment, a predefined pattern dependent on the address is stored into the SDRAM address parity memory cell locations on a write burst to memory. The address parity pattern retrieved during a read burst is compared to an expected pattern generated from the read address. If the read and write burst address parity patterns do not compare, either an addressing failure or a single bit error is reported, depending upon how the patterns miscompare. This method allows the ECC scheme to be the same on the processor bus and the memory interface because address parity is not incorporated into the ECC on the memory interface. This reduces memory access latency.

Figure 2:
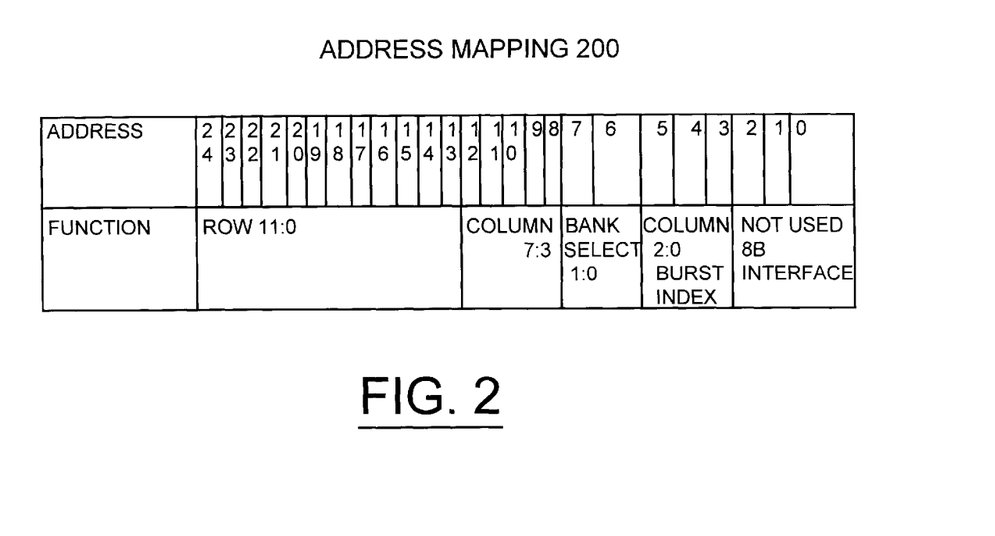
FIG. 2 is a block diagram representation illustrating exemplary address mapping for implementing address error detection in accordance with the preferred embodiment.

Referring now to FIGS. 1 and 2, in FIG. 2 there is shown exemplary address mapping generally designated by the reference character 200 for implementing address error detection in accordance with the preferred embodiment. L3 cache or DDR SDRAM 0-2, 106 is controlled by memory controller 104, for example, an ASIC chip that interfaces through the system bus to the processor 102. The system bus implements, for example, a standard 8-bit SECDED ECC method for each 64 bits of data. The same ECC method is used on the L3 cache interface. The L3 cache or DDR SDRAM 0-2, 106 is formed with X32 DDR SDRAMs. All operations to the L3 cache 106 are full cache lines. The SDRAM accesses, for example, are done with interleaved burst type and a burst length of 8. The address is mapped into Row, Column, and Bank Select bits as shown in FIG. 2. The lower 3 column address bits (2:0) are used as the burst index. Address parity is generated on the address (Row, Column, and Bank Select bits) used to access the SDRAM 106. Burst index column address bits 5:4 are excluded from the parity generation to simplify address parity pattern generation. It should be understood that these burst index column address bits 5:4 could be included at the expense of additional complexity. The row and column address bits are multiplexed on an access to the SDRAM 106, so an addressing error on one of the two column bits not used for address parity pattern generation will be detected when a row address drives the address line.

Figure 3:
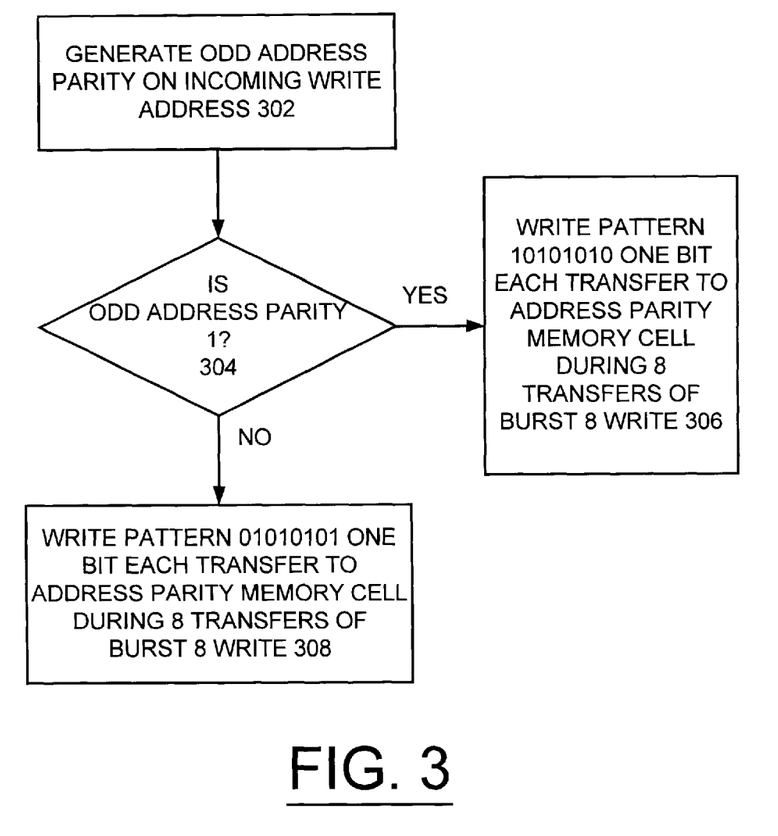
FIG. 3 is a logic flow diagram illustrating exemplary sequential steps, for generating address parity and implementing address error detection in accordance with a first preferred embodiment.

Referring now to FIG. 3, there are shown exemplary sequential steps for generating address parity for implementing address error detection in accordance with the preferred embodiment. When data is written into the SDRAM 106, odd address parity is generated on the write address as indicated in a block 302. Checking whether the value for the odd address parity is a 1 is performed as indicated in a decision block 304. If the value of odd address parity is a 1, then the pattern 10101010 is written one bit each transfer to the address parity memory cell during the 8 transfers of the burst 8 write as indicated in a block 306. If the value of odd address parity is a 0, then the pattern 01010101 is written one bit each transfer to the address parity memory cell during the 8 transfers of the burst 8 write as indicated in a block 308.

Figure 4:
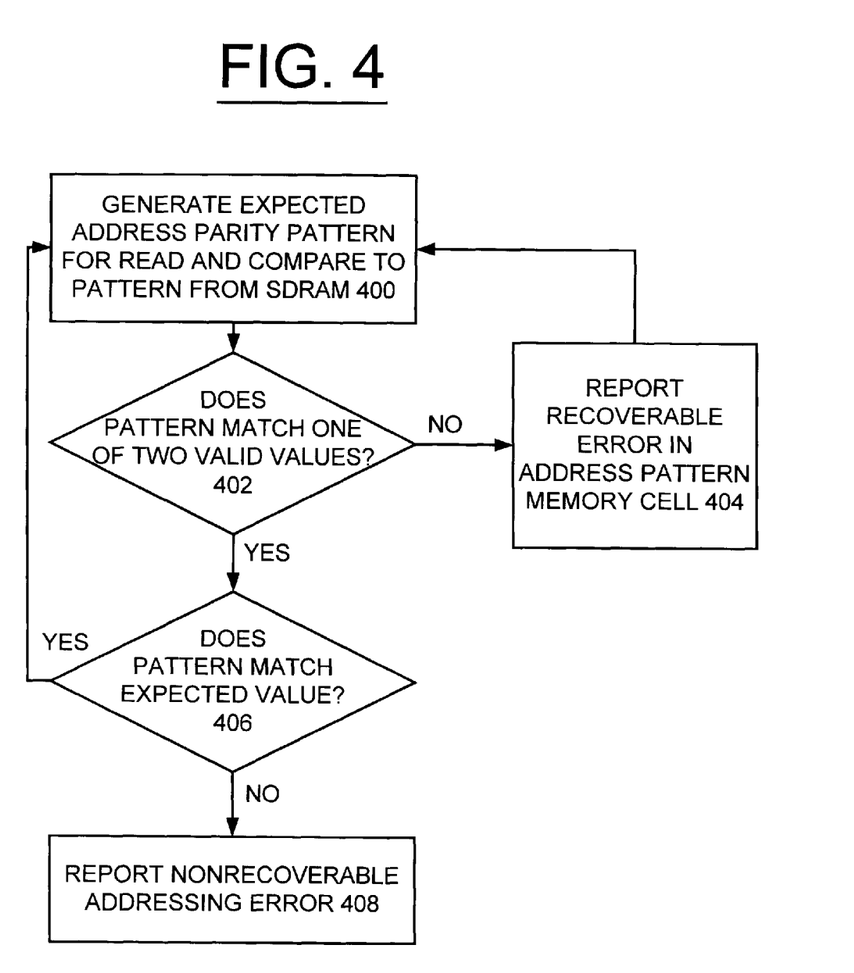
FIG. 4 is a logic flow diagram illustrating exemplary sequential steps for implementing address error detection using the generated address parity of FIG. 3 in accordance with the first preferred embodiment.

FIG. 4 illustrates exemplary sequential steps for implementing address error detection using the generated address parity of FIG. 3 in accordance with the preferred embodiment. When data is read from the SDRAM 106, odd address parity is generated on the read address. If the value of odd address parity for the read addresses generated to be a 1, then the expected address parity pattern is 10101010 for the 8 data transfers of a burst 8 read. If the value of odd address parity for the read addresses generated to be a 0, then the expected address parity pattern is 01010101 for the 8 data transfers of a burst 8 read. When a read operation is performed on the SDRAM 106, the expected address parity pattern for the read is generated and compared to the actual value of the address parity pattern read from the SDRAM as indicated in a block 400. If the address parity pattern read from the DRAMs matches the expected address parity pattern, no action is taken. Otherwise, checking if the pattern matches one of two valid values is performed as indicated in a decision block 402. If the pattern does not match one of two valid values (10101010 or 01010101), then a recoverable error in an address pattern memory cell is reported as indicated in a block 404 and processing continues at block 400. Software can monitor the number of recoverable memory cell errors reported and halt processing if a threshold is reached. If the pattern matches one of two valid values, then checking whether the pattern matches the expected value is performed as indicated in a decision block 406. If the pattern matches one of two valid values and matches with the expected value, processing continues at block 400. If the pattern matches one of two valid values but it matches with the wrong value, a non-recoverable addressing error is reported as indicated in a block 408 and processing is halted. A failure in a single address net to the SDRAM 106 will result in matching the wrong expected value and processing is halted.

In accordance with features of the second preferred embodiment, the possibility of a single bit error on the address parity from causing a machine check or halting processing is eliminated. Also the detection of stuck-at address line is improved. Taking advantage of burst transfers, such as burst 8 reads and writes, an ECC code based on the address is stored in each address parity bit of a burst. For example, a hamming code or ECC code on the address, with the property of a single bit correct, double bit detect (SBCDBD) is used. Then 22 address bits would require 6 bits to generate the SBCDBD ECC code for the address. With the even parity (EP) and parity bits, this generates 32 unique patterns to be burst encoded in the address parity bit. These patterns are non-repeating if an address line is stuck at a value. For example, address 0x00000 and 0x10040 differ in RAS/CAS encoding by having bit L3_IO_DRAMADR(0) be 0 for 0x00000 and 1 for 0x110040. P1–5 for 0x00000 is 00000 and P1–5 for 0x10040 is 00101.

Figure 5:
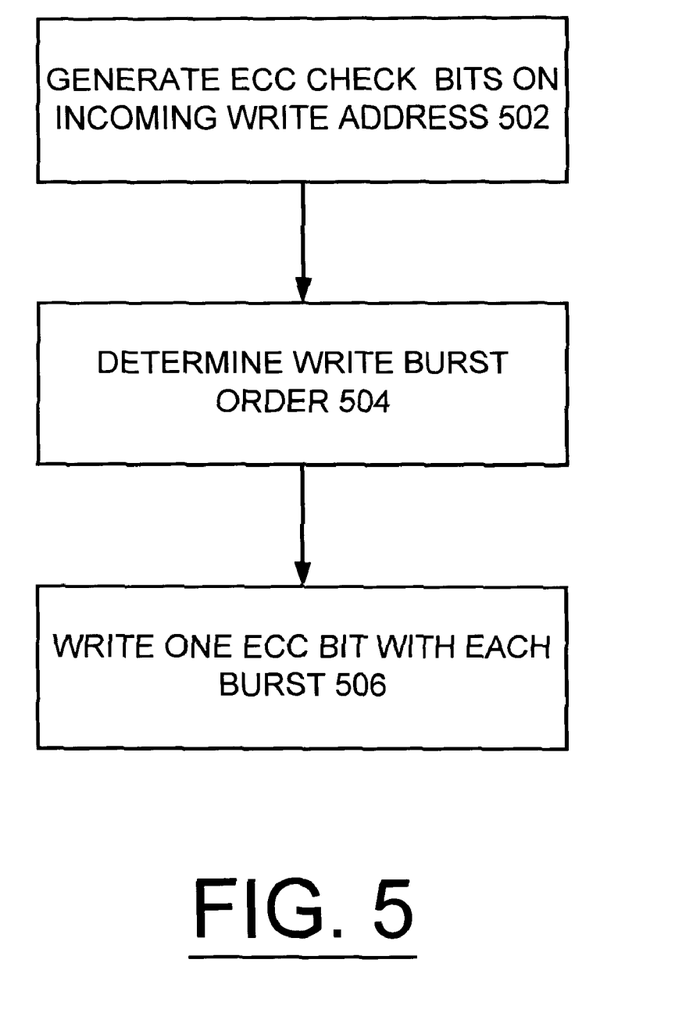
FIG. 5 is a logic flow diagram illustrating exemplary sequential steps for generating ECC and implementing address error detection in accordance with a second preferred embodiment.

FIG. 5 illustrates exemplary sequential steps for generating ECC for implementing address error detection in accordance with a second preferred embodiment. First ECC check bits are generated on the incoming write address as indicated in a block 502. For example, encode bits are 0 to start and the address is loaded. P1–5 are generated, for example, according to the following equations:

P1=1 XOR 3 XOR 5 XOR 7 XOR 9 XOR 11 XOR 13 XOR 15 XOR 17 XOR 19 XOR 21 XOR 23 XOR 25 XOR 27 XOR 29 XOR 31;

P2=2 XOR 3 XOR 6 XOR 7 XOR 10 XOR 11 XOR 14 XOR 15 XOR 18 XOR 19 XOR 22 XOR 23 XOR 26 XOR 27 XOR 30 XOR 31;

P3=4 XOR 5 XOR 6 XOR 7 XOR 12 XOR 13 XOR 14 XOR 15 XOR 20 XOR 21 XOR 22 XOR 23 XOR 29 XOR 30 XOR 31 XOR 32;

P4=8 XOR 9 XOR 10 XOR 11 XOR 12 XOR 13 XOR 14 XOR 15 XOR 24 XOR 25 XOR 26 XOR 27 XOR 28 XOR 29 XOR 30 XOR 31;

P5=16 XOR 17 XOR 18 XOR 19 XOR 20 XOR 21 XOR 22 XOR 23 XOR 24 XOR 25 XOR 26 XOR 27 XOR 28 XOR 29 XOR 30 XOR 31;

where EP=encode(28)=even_parity(1–28).

Next the write order burst is determined as indicated in a block 504. Writes on the L3 SDRAM interface, for example, are cacheline aligned and the burst order is 0–7. Then one ECC bit is written with each burst as indicated in a block 506. ECC bits P1–5, the EP in burst 0–5 and zeroes are written burst 6 and 7.

Figure 6:
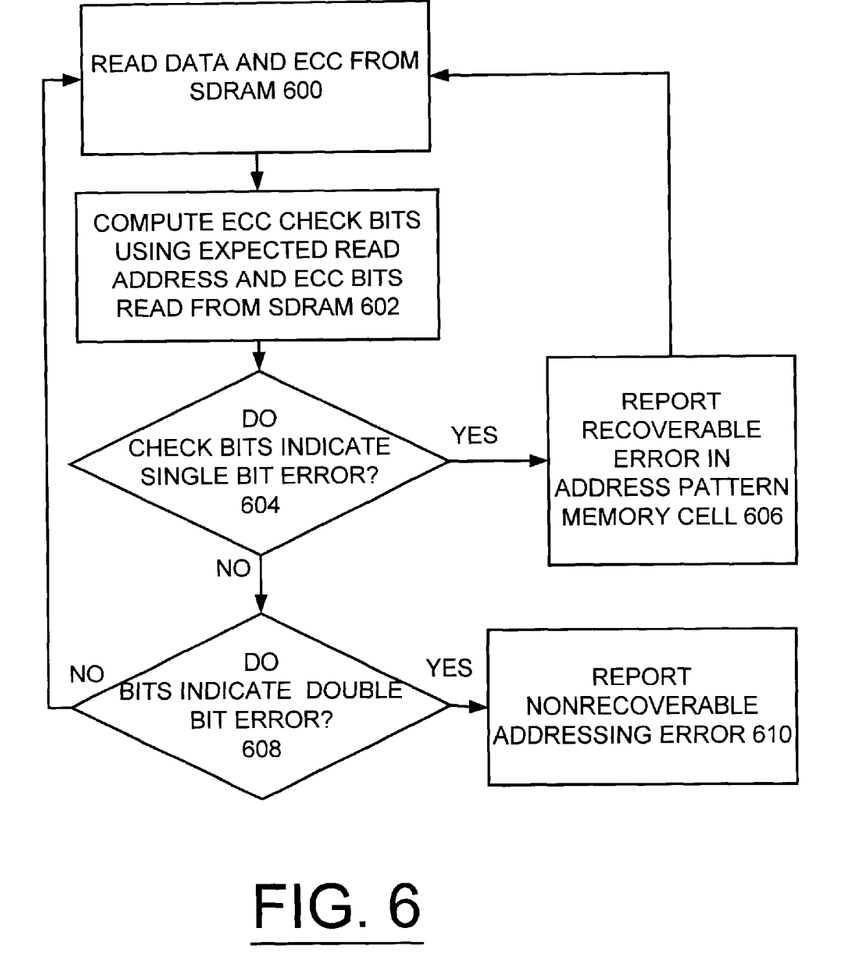
FIG. 6 is a logic flow diagram illustrating alternative exemplary sequential steps for implementing address error detection using the generated ECC of FIG. 5 in accordance with the second preferred embodiment.

FIG. 6 illustrates alternative exemplary sequential steps for implementing address error detection using the generated ECC of FIG. 5 in accordance with the second preferred embodiment. When performing a read, data and ECC are read from the SDRAM 106 as indicated in a block 600. ECC check bits are computed using the expected read address and the ECC bits read from the SDRAM 106 as indicated in a block 602. For example, C1–C5 are calculated according to the following equations.

C1=1 XOR 3 XOR 5 XOR 7 XOR 9 XOR 11 XOR 13 XOR 15 XOR 17 XOR 19 XOR 21 XOR 23 XOR 25 XOR 27 XOR 29 XOR 31;

C2=2 XOR 3 XOR 6 XOR 7 XOR 10 XOR 11 XOR 14 XOR 15 XOR 18 XOR 19 XOR 22 XOR 23 XOR 26 XOR 27 XOR 30 XOR 31;

C3=4 XOR 5 XOR 6 XOR 7 XOR 12 XOR 13 XOR 14 XOR 15 XOR 20 XOR 21 XOR 22 XOR 23 XOR 29 XOR 30 XOR 31 XOR 32;

C4=8 XOR 9 XOR 10 XOR 11 XOR 12 XOR 13 XOR 14 XOR 15 XOR 24 XOR 25 XOR 26 XOR 27 XOR 28 XOR 29 XOR 30 XOR 31;

C5=16 XOR 17 XOR 18 XOR 19 XOR 20 XOR 21 XOR 22 XOR 23 XOR 24 XOR 25 XOR 26 XOR 27 XOR 28 XOR 29 XOR 30 XOR 31;

Checking whether the check bits indicate a single bit error is performed as indicated in a decision block 604. When the check bits indicate a single bit error, then a recoverable error in address pattern memory cell is reported as indicated in a block 606 and the sequential operations continue at block 600. Otherwise, checking whether the check bits indicate a double bit error is performed as indicated in a decision block 608. When the check bits indicate a double bit error, then a non-recoverable addressing error is reported as indicated in a block 610. When the check bits do not indicate a double bit error, then the sequential operations continue at block 600.

Figure 7:
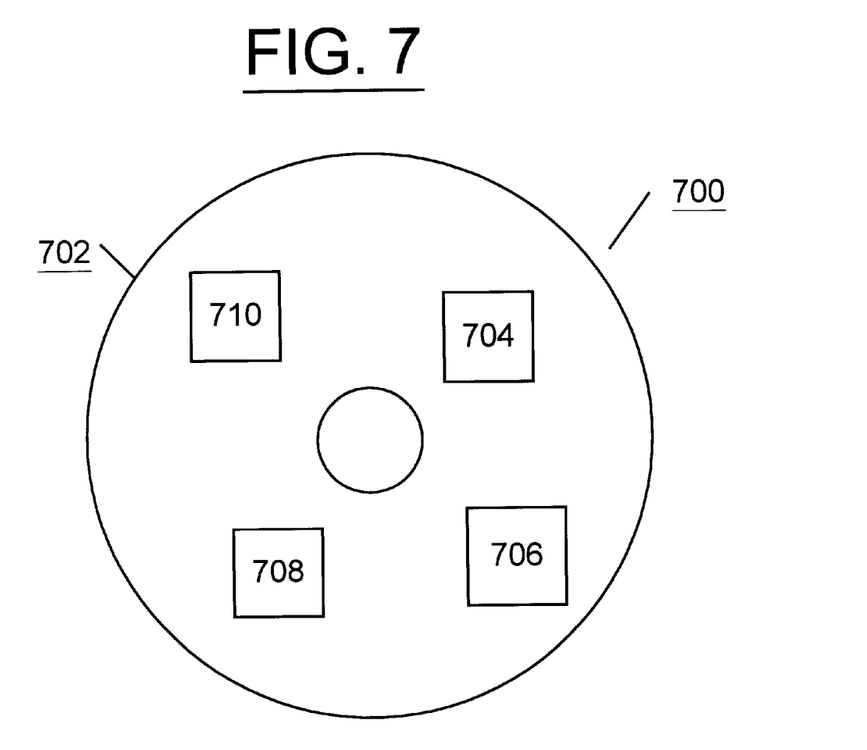
FIG. 7 is a block diagram illustrating a computer program product in accordance with the preferred embodiment.

Referring now to FIG. 7, an article of manufacture or a computer program product 700 of the invention is illustrated. The computer program product 700 includes a recording medium 702, such as, a floppy disk, a high capacity read only memory in the form of an optically read compact disk or CD-ROM, a tape, a transmission type media such as a digital or analog communications link, or a similar computer program product. Recording medium 702 stores program means 704, 706, 708, 710 on the medium 702 for carrying out the methods for implementing address error detection of the preferred embodiment in the system 100 of FIG. 1.

A sequence of program instructions or a logical assembly of one or more interrelated modules defined by the recorded program means 704, 706, 708, 710, direct the computer system 100 for implementing address error detection of the preferred embodiment.

While the present invention has been described with reference to the details of the embodiments of the invention shown in the drawing, these details are not intended to limit the scope of the invention as claimed in the appended claims.

What is claimed is:

1. A synchronous dynamic random access memory (SDRAM) address error detection method comprising the steps of:
   generating a predefined pattern for a write burst to the SDRAM; said predefined pattern dependent on a write address;
   sequentially storing a bit of said predefined pattern into a respective address memory cell location in the SDRAM on each burst transfer of said write burst to the SDRAM;
   generating an expected pattern from a read address;
   retrieving said stored predefined pattern during a read burst;
   comparing said retrieved predefined pattern to said generated expected pattern for identifying a type of an addressing error.

2. A synchronous dynamic random access memory (SDRAM) address error detection method as recited in claim 1 includes the step of reporting an error responsive to said compared patterns not matching.

3. A synchronous dynamic random access memory (SDRAM) address error detection method as recited in claim 2 wherein the step of reporting an error responsive to said compared patterns not matching includes the step of distinguishing the difference between an addressing failure and an address parity memory cell failure based upon a sequence of the compared stored predefined pattern.

4. A synchronous dynamic random access memory (SDRAM) address error detection method comprising the steps of:
   generating a predefined pattern for a write burst to the SDRAM including calculating an odd address parity on the write address; responsive to said calculated odd address parity on the write address of a one, writing a first predefined pattern;
   sequentially storing a bit of said predefined pattern into the SDRAM on each burst transfer of said write burst to the SDRAM;
   generating an expected pattern from a read address;
   retrieving said stored predefined pattern during a read burst;
   comparing said retrieved predefined pattern to said generated expected pattern for identifying a type of an addressing error.

5. A synchronous dynamic random access memory (SDRAM) address error detection method as recited in claim 4 wherein the step of writing said first predefined pattern includes the step of writing a predefined pattern of 10101010 with one bit each transfer of the address parity memory cell during the transfer of the burst 8 write.

6. A synchronous dynamic random access memory (SDRAM) address error detection method as recited in claim 4 includes the step responsive to said calculated odd address parity on the write address of a zero, writing a second predefined pattern.

7. A synchronous dynamic random access memory (SDRAM) address error detection method as recited in claim 6 wherein the step of writing said second predefined pattern includes the step of writing a predefined pattern of 01010101 with one bit each transfer of the address parity memory cell during the transfer of the burst 8 write.

8. A synchronous dynamic random access memory (SDRAM) address error detection method as recited in claim 1 wherein the step of generating a predefined pattern for a write burst to the SDRAM includes the steps of calculating an error correction code (ECC) on the write address.

9. A synchronous dynamic random access memory (SDRAM) address error detection method as recited in claim 8 wherein the step of calculating an error correction code (ECC) on the write address includes the step of calculating an error correction code (ECC) on the write address; said ECC having a property of single-bit correct, double-bit detect.

10. A synchronous dynamic random access memory (SDRAM) address error detection method as recited in claim 8 wherein the step of sequentially storing a bit of said predefined pattern into the SDRAM on each burst transfer of said write burst to the SDRAM includes the step of determining a write burst order.

11. A synchronous dynamic random access memory (SDRAM) address error detection method as recited in claim 8 wherein the step of sequentially storing a bit of said predefined pattern into the SDRAM on each burst transfer of said write burst to the SDRAM includes the step of writing one EGG bit with each burst transfer.

12. Apparatus for implementing synchronous dynamic random access memory (SDRAM) address error detection comprising:
   a processor;
   a memory controller coupled to said processor by a system bus;
   a synchronous dynamic random access memory (SDRAM) coupled to said memory controller; said SDRAM having a plurality of address memory cell locations; and
   said memory controller arranged for generating a predefined pattern for a write burst to the SDRAM; said predefined pattern dependent on a write address; for sequentially storing a bit of said predefined pattern into the SDRAM on each burst transfer of said write burst to a respective one of said plurality of address memory cell locations in the SDRAM; for generating an expected pattern from a read address for a read burst; for retrieving said stored predefined pattern during said read burst and for comparing said retrieved predefined pattern to said generated expected pattern for identifying a type of an addressing error.

13. Apparatus for implementing synchronous dynamic random access memory (SDRAM) address error detection as recited in claim 12 wherein said memory controller distinguishes the difference between an addressing failure and an address parity memory cell failure based upon a sequence of the compared stored predefined pattern.

14. Apparatus for implementing synchronous dynamic random access memory (SDRAM) address error detection comprising:
   a processor;
   a memory controller coupled to said processor by a system bus;
   a synchronous dynamic random access memory (SDRAM) coupled to said memory controller; said SDRAM having a plurality of address cell locations; and
   said memory controller generates said a predefined pattern for a write burst to the SDRAM by calculating an odd address parity on the write address; and responsive to said calculated odd address parity on the write address of a one, writing a first predefined pattern; sequentially storing a bit of said predefined pattern into the SDRAM on each burst transfer of said write burst to a respective one of said plurality of address cell locations in the SDRAM; generating an expected pattern from a read address for a read burst; retrieving said stored predefined pattern during said read burst; and comparing said retrieved predefined pattern to said generated expected pattern for identifying a type of an addressing error.

15. Apparatus for implementing synchronous dynamic random access memory (SDRAM) address error detection as recited in claim 14 wherein said memory controller generates said predefined pattern for said write burst to the SDRAM by writing a second predefined pattern responsive to said calculated odd address parity on the write address of a zero.

16. Apparatus for implementing synchronous dynamic random access memory (SDRAM) address error detection as recited in claim 12 wherein said memory controller generates said predefined pattern for said write burst to the SDRAM by calculating an error correction code (ECC) on the write address.

17. Apparatus for implementing synchronous dynamic random access memory (SDRAM) address error detection as recited in claim 12 wherein said memory controller generates said predefined pattern for said write burst to the SDRAM by calculating an error correction code (ECC) on the write address; said ECC having a property of single-bit correct, double-bit detect.

18. Apparatus for implementing synchronous dynamic random access memory (SDRAM) address error detection as recited in claim 12 wherein said memory controller generates said predefined pattern for said write burst to the SDRAM by calculating an error correction code (ECC) on the write address; said calculated ECC on the write address generating a unique pattern.

19. A computer program product for implementing synchronous dynamic random access memory (SDRAM) address error detection in a computer system, said computer system having a processor; a memory controller coupled to said processor by a system bus; a synchronous dynamic random access memory (SDRAM) coupled to said memory controller; said SDRAM having a plurality of address cell locations, said computer program product including a plurality of computer executable instructions stored on a computer readable medium, wherein said instructions, when executed by said memory controller, cause the memory controller to perform the steps of:

generating a predefined pattern for a write burst to the SDRAM; said predefined pattern dependent on a write address;

sequentially storing a bit of said predefined pattern into a respective address memory cell location in the SDRAM on each burst transfer of said write burst to the SDRAM;

generating an expected pattern from a read address for a read burst;

retrieving said stored predefined pattern during said read burst;

comparing said retrieved predefined pattern to said generated expected pattern for identifying a type of an addressing error.

20. A computer program product for implementing synchronous dynamic random access memory (SDRAM) address error detection as recited in claim 19 wherein said memory controller distinguishes the difference between an addressing failure and an address parity memory cell failure based upon a sequence of the compared stored predefined pattern.

* * * * *